(12) United States Patent
Shu et al.

(10) Patent No.: US 11,327,383 B2
(45) Date of Patent: May 10, 2022

(54) DISPLAY PANEL WITH LIGHT TRANSMITTANCE CONTROLLED BY GATE LINE AND DATA LINE

(71) Applicant: BOE Technology Group Co., Ltd., Beijing (CN)

(72) Inventors: Shi Shu, Beijing (CN); Chuanxiang Xu, Beijing (CN); Jiangnan Lu, Beijing (CN); Yang Yue, Beijing (CN); Yue Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 606 days.

(21) Appl. No.: 16/303,358

(22) PCT Filed: Dec. 7, 2017

(86) PCT No.: PCT/CN2017/115075
§ 371 (c)(1),
(2) Date: Nov. 20, 2018

(87) PCT Pub. No.: WO2019/109315
PCT Pub. Date: Jun. 13, 2019

(65) Prior Publication Data
US 2021/0223655 A1    Jul. 22, 2021

(51) Int. Cl.
*G09G 3/3225* (2016.01)
*G09G 3/38* (2006.01)
(Continued)

(52) U.S. Cl.
CPC .............. *G02F 1/157* (2013.01); *G02F 1/155* (2013.01); *G09G 3/3225* (2013.01); *G09G 3/38* (2013.01);
(Continued)

(58) Field of Classification Search
CPC .... H01L 27/3232; G09G 3/3433; G09G 3/34; G09G 3/38
See application file for complete search history.

(56) References Cited

U.S. PATENT DOCUMENTS

2003/0052869 A1    3/2003  Fujii et al.
2008/0165302 A1*   7/2008  Yasui ................... G09G 3/3648
                                                              349/48
(Continued)

FOREIGN PATENT DOCUMENTS

AU    2017416078 B2    6/2019
CN     102890906 A     1/2013
(Continued)

OTHER PUBLICATIONS

First Office Action in the Korean Patent Application No. 20187034475, dated Dec. 6, 2019; English translation attached.
(Continued)

*Primary Examiner* — Kevin M Nguyen
(74) *Attorney, Agent, or Firm* — Intellectual Valley Law, P.C.

(57) ABSTRACT

The present application discloses a display panel having an array of a plurality of subpixels. The display panel includes a plurality of light modulators configured to modulate display contrast of the display panel. Each of the plurality of light modulators is in a light modulation region configured to allow light transmitting through the display panel. Light transmittance in the light modulation region is controlled by a first gate line and a first data line for driving image display in a first subpixel of the plurality of subpixels.

16 Claims, 9 Drawing Sheets

(51) Int. Cl.
    *G02F 1/157*      (2006.01)
    *G02F 1/155*      (2006.01)
    *H01L 27/32*      (2006.01)
    *H01L 27/12*      (2006.01)

(52) U.S. Cl.
    CPC ...... *H01L 27/3232* (2013.01); *H01L 27/3262* (2013.01); *G02F 2201/44* (2013.01); *G09G 2300/046* (2013.01); *G09G 2300/0426* (2013.01); *G09G 2310/0202* (2013.01); *G09G 2320/066* (2013.01); *H01L 27/124* (2013.01)

(56) References Cited

U.S. PATENT DOCUMENTS

| | | | | |
|---|---|---|---|---|
| 2009/0121985 | A1* | 5/2009 | Kang | G09G 3/3233 345/82 |
| 2012/0327498 | A1 | 12/2012 | Arai et al. | |
| 2013/0328945 | A1* | 12/2013 | Kim | G02F 1/136286 345/690 |
| 2014/0293192 | A1 | 10/2014 | Hatano | |
| 2015/0144891 | A1* | 5/2015 | Park | H01L 51/5284 257/40 |
| 2015/0170588 | A1* | 6/2015 | Yamazaki | G02F 1/13624 345/204 |
| 2015/0243224 | A1 | 8/2015 | Zhuang et al. | |
| 2015/0325180 | A1* | 11/2015 | Silva | G09G 3/3433 345/690 |
| 2016/0035799 | A1 | 2/2016 | Chang | |
| 2016/0299381 | A1 | 10/2016 | Lu et al. | |
| 2017/0212398 | A1 | 7/2017 | Cao et al. | |
| 2017/0249908 | A1 | 8/2017 | Berdinis et al. | |
| 2018/0145118 | A1* | 5/2018 | Kim | H01L 27/326 |
| 2018/0190735 | A1* | 7/2018 | Son | G02F 1/133512 |
| 2018/0226463 | A1 | 8/2018 | Hsin et al. | |

FOREIGN PATENT DOCUMENTS

| | | |
|---|---|---|
| CN | 204332265 U | 5/2015 |
| CN | 104849909 A | 8/2015 |
| CN | 104965338 A | 10/2015 |
| CN | 105070737 A | 11/2015 |
| CN | 105428392 A | 3/2016 |
| JP | H079134 A | 1/1995 |
| JP | 2003076302 A | 3/2003 |
| JP | 2010537226 A | 12/2010 |
| JP | 2013003480 A | 1/2013 |
| JP | 2013127862 A | 6/2013 |
| JP | 2013221965 A | 10/2013 |
| JP | 2014209214 A | 11/2014 |
| JP | 2017500594 A | 1/2017 |

OTHER PUBLICATIONS

International Search Report & Written Opinion dated Aug. 29, 2018, regarding PCT/CN2017/115075.
First Office Action in the Japanese Patent Application No. 2018563810, dated Aug. 16, 2021; English translation attached.
Extended European Search Report in the European Patent Application No. 17909648.2, dated Nov. 8, 2021.
First Office Action in the Vietnamese Patent Application No. 1201805386, dated Feb. 16, 2022; English translation attached.
Decision of Refusal in the Japanese Patent Application No. 2018563810, dated Feb. 21, 2022; English translation attached.
First Office Action in the Chinese Patent Application No. 201780002302.4, dated Mar. 11, 2022; English translation attached.

* cited by examiner

OFF state

ON state

DISPLAY PANEL WITH LIGHT TRANSMITTANCE CONTROLLED BY GATE LINE AND DATA LINE

CROSS-REFERENCE TO RELATED APPLICATION

This application is a national stage application under 35 U.S.C. § 371 of International Application No. PCT/CN2017/115075, filed Dec. 7, 2017, the contents of which are incorporated by reference in the entirety.

TECHNICAL FIELD

The present invention relates to display technology, more particularly, to a display panel having a light modulation region, a display apparatus, a method of modulating display contrast of the display panel, and a method of fabricating a display panel.

BACKGROUND

Display apparatuses such as liquid crystal display (LCD) apparatuses and organic light-emitting diode (OLED) display apparatuses have been widely used. LCD and OLED display devices use thin film transistor (TFT) to control pixels in the display panel.

SUMMARY

In one aspect, the present disclosure provides a display panel having an array of a plurality of subpixels, comprising a plurality of light modulators configured to modulate display contrast of the display panel, each of the plurality of light modulators is in a light modulation region configured to allow light transmitting through the display panel; wherein light transmittance in the light modulation region is controlled by a first gate line and a first data line for driving image display in a first subpixel of the plurality of subpixels.

Optionally, each of the plurality of light modulators comprises a first electrode, an electrochromic layer on the first electrode, and a second electrode on a side of the electrochromic layer distal to the first electrode.

Optionally, the display panel comprises a first thin film transistor in the light modulation region having a gate electrode coupled to the first gate line, a source electrode coupled to the first electrode, and a drain electrode coupled to ground.

Optionally, the first thin film transistor is a leaky transistor.

Optionally, the display panel comprises a second thin film transistor in the first subpixel comprising a gate electrode coupled to the first gate line, a source electrode coupled to the first data line, and a drain electrode coupled to a third electrode in the first subpixel.

Optionally, the second thin film transistor in the first subpixel further comprising an active layer; and the source electrode of the first thin film transistor is coupled to the active layer of the second thin film transistor.

Optionally, the third electrode in the first subpixel and the first electrode in the light modulation region are in a same layer and made of a same material.

Optionally, the display panel further comprises an organic light emitting layer on a side of the third electrode distal to the second thin film transistor; and a fourth electrode on a side of the organic light emitting layer distal to the third electrode; wherein the fourth electrode in the first subpixel and the second electrode in the light modulation region are in a same layer and made of a same material.

Optionally, the light modulation region is substantially non-overlapping with the plurality of subpixels.

Optionally, the first subpixel is a subpixel adjacent to the light modulation region.

Optionally, a number of the plurality of light modulators is substantially the same as a number of the plurality of subpixels.

Optionally, the display panel is a transparent display panel.

In another aspect, the present disclosure provides a display apparatus comprising the display panel described herein or fabricated by a method described herein.

In another aspect, the present disclosure provides a method of modulating display contrast of the display panel described herein or fabricated by a method described herein, comprising providing a first gate scanning signal to the first gate line and a first data signal to the first date line for driving image display in the first subpixel of the plurality of subpixels; and modulating the light transmittance in the light modulation region using the first gate scanning signal and the first data signal.

Optionally, each of the plurality of light modulators comprises a first electrode, an electrochromic layer on the first electrode, and a second electrode on a side of the electrochromic layer distal to the first electrode; and modulating the light transmittance comprises lowering the light transmittance in the light modulation region by applying to the first electrode a voltage signal derived from the first data signal.

Optionally, the display panel comprises a first thin film transistor in the light modulation region having a gate electrode coupled to the first gate line, a source electrode coupled to the first electrode, and a drain electrode coupled to ground, and a second thin film transistor in the first subpixel having a gate electrode coupled to the first gate line, a source electrode coupled to the first data line, and a drain electrode coupled to a third electrode in the first subpixel; the method further comprises providing the first gate scanning signal to the first gate line to turn on the second thin film transistor thereby allowing the first data signal to pass from the source electrode of the second thin film transistor to the drain electrode of the second thin film transistor for driving image display in the first subpixel; and providing the first gate scanning signal to the first gate line to turn on the first thin film transistor thereby allowing the first data signal to pass from the source electrode of the first thin film transistor to the drain electrode of the first thin film transistor.

Optionally, the first thin film transistor is a leaky transistor; and a voltage level of the voltage signal applied to the first electrode is lower than a voltage level of the first data signal.

In another aspect, the present disclosure provides a method of fabricating a display panel having an array of a plurality of subpixels, comprising forming a plurality of light modulators configured to modulate display contrast of the display panel, each of the plurality of light modulators is formed in a light modulation region configured to allow light transmitting through the display panel; and forming a plurality of gate lines and forming a plurality of data lines for driving image display in the plurality of subpixels; wherein the plurality of light modulators, the plurality of gate lines, and the plurality of data lines are formed so that light transmittance in the light modulation region is controlled by a first gate line and a first data line for driving image display in a first subpixel of the plurality of subpixels.

Optionally, each of the plurality of light modulators is formed to comprise a first electrode, an electrochromic layer on the first electrode, and a second electrode on a side of the electrochromic layer distal to the first electrode; the method further comprises forming a first thin film transistor in the light modulation region having a gate electrode coupled to the first gate line, a source electrode coupled to the first electrode, and a drain electrode coupled to ground.

Optionally, the first thin film transistor is formed to have a leakage current such that a difference between a gray level of the light modulation region and a gray level of the first subpixel upon application of a first data signal through the first data line are substantially minimized over a range of data voltage levels.

Optionally, the method further comprises forming a second thin film transistor in the first subpixel having a gate electrode coupled to the first gate line, a source electrode coupled to the first data line, and a drain electrode coupled to a third electrode in the first subpixel.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional display panels, in particular transparent display panels, the display contrast deteriorates when the ambient light intensity is relatively high e.g., in an outdoor environment or when the display panel is a transparent display panel. This makes it difficult for the readers to view the displayed image. Readers may increase the brightness of the outdoor display panel in order to view the image display better. However, this leads to much higher power consumption.

Accordingly, the present disclosure provides, inter alia, a display panel having a light modulation region, a display apparatus, a method of modulating display contrast of the display panel, and a method of fabricating a display panel that substantially obviate one or more of the problems due to limitations and disadvantages of the related art. In one aspect, the present disclosure provides a display panel having an array of a plurality of subpixels. In some embodiments, the display panel includes a plurality of light modulators configured to modulate display contrast of the display panel. Each of the plurality of light modulators is in a light modulation region configured to allow light transmitting through the display panel. Optionally, light transmittance in the light modulation region is controlled by a first gate line and a first data line for driving image display in a first subpixel of the plurality of subpixels.

Figure 1:
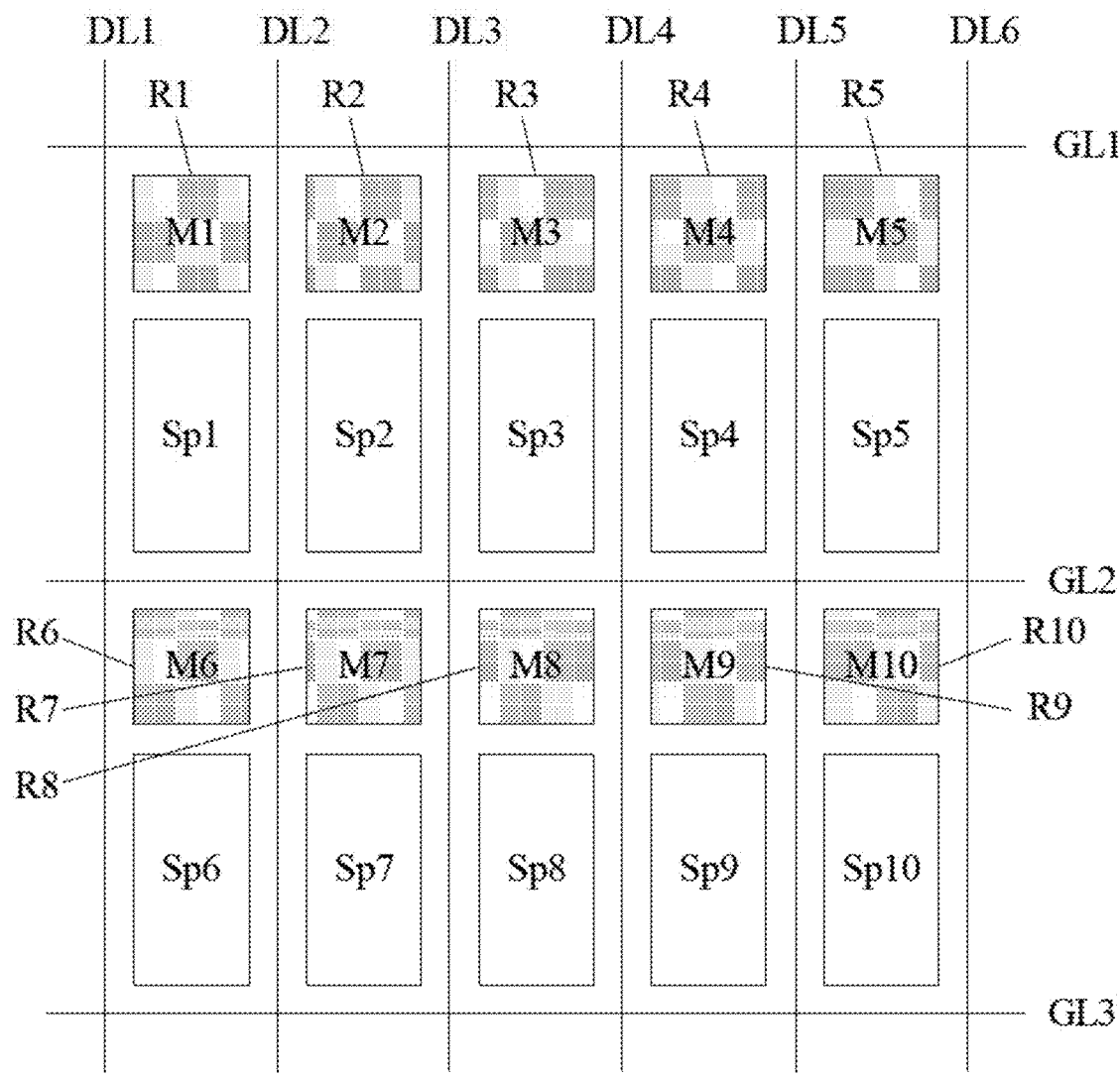
FIG. 1 is a schematic diagram illustrating a display panel having a light modulation region in some embodiments according to the present disclosure.

FIG. 1 is a schematic diagram illustrating a display panel having a light modulation region in some embodiments according to the present disclosure. Referring to FIG. 1, the display panel includes a plurality of subpixels, e.g., subpixels Sp1, Sp2, Sp3, Sp4, Sp10, and a plurality of light modulators (e.g., light modulators M1, M2, M3, . . . , M10) in a plurality of light modulation region (e.g., light modulation regions R1, R2, R3, . . . , R10), respectively. The plurality of light modulators are configured to modulate display contrast of the display panel. Optionally, each of the plurality of light modulation regions is configured to allow light transmitting through the display panel. In one example, each of the plurality of light modulation regions is a substantially transparent region that allows light (e.g., ambient light) transmitting through the display panel when the display panel is in an OFF state. Optionally, the display panel is a transparent display panel that allows a viewer to see through the display panel, e.g., when the display panel is turned off.

The display panel further includes a plurality of gate lines (e.g., gate lines GL1, GL2, and GL3) and a plurality of data lines (e.g., data lines DL1, DL2, DL3, . . . , DL6) for driving image display in the plurality of subpixels. For example, a first gate line GL1 and a first data line DL1 are configured to drive image display in a first subpixel Sp1, the first gate line GL1 and a second data line DL2 are configured to drive image display in a second subpixel Sp2, and so on. Light transmittance in each of the plurality of light modulation regions are also controlled by one of the plurality of gate lines and one of the plurality of data lines for driving image display in one of the plurality of subpixels. For example, the light transmittance in a first light modulation region R1 is controlled by the first gate line GL1 and the first data line DL1 for driving image display in the first subpixel Sp1, the light transmittance in a second light modulation region R2 is controlled by the first gate line GL1 and the second data line DL2 for driving image display in the second subpixel Sp2, and so on.

As shown in FIG. 1, a number of the plurality of light modulation regions is the same as a number of the plurality of subpixels in the display panel, e.g., each of the plurality of subpixels is associated with one of the plurality of light modulation regions. Each of the plurality of light modulation regions is disposed on a side of the corresponding subpixel of the plurality of subpixels.

Figure 2:
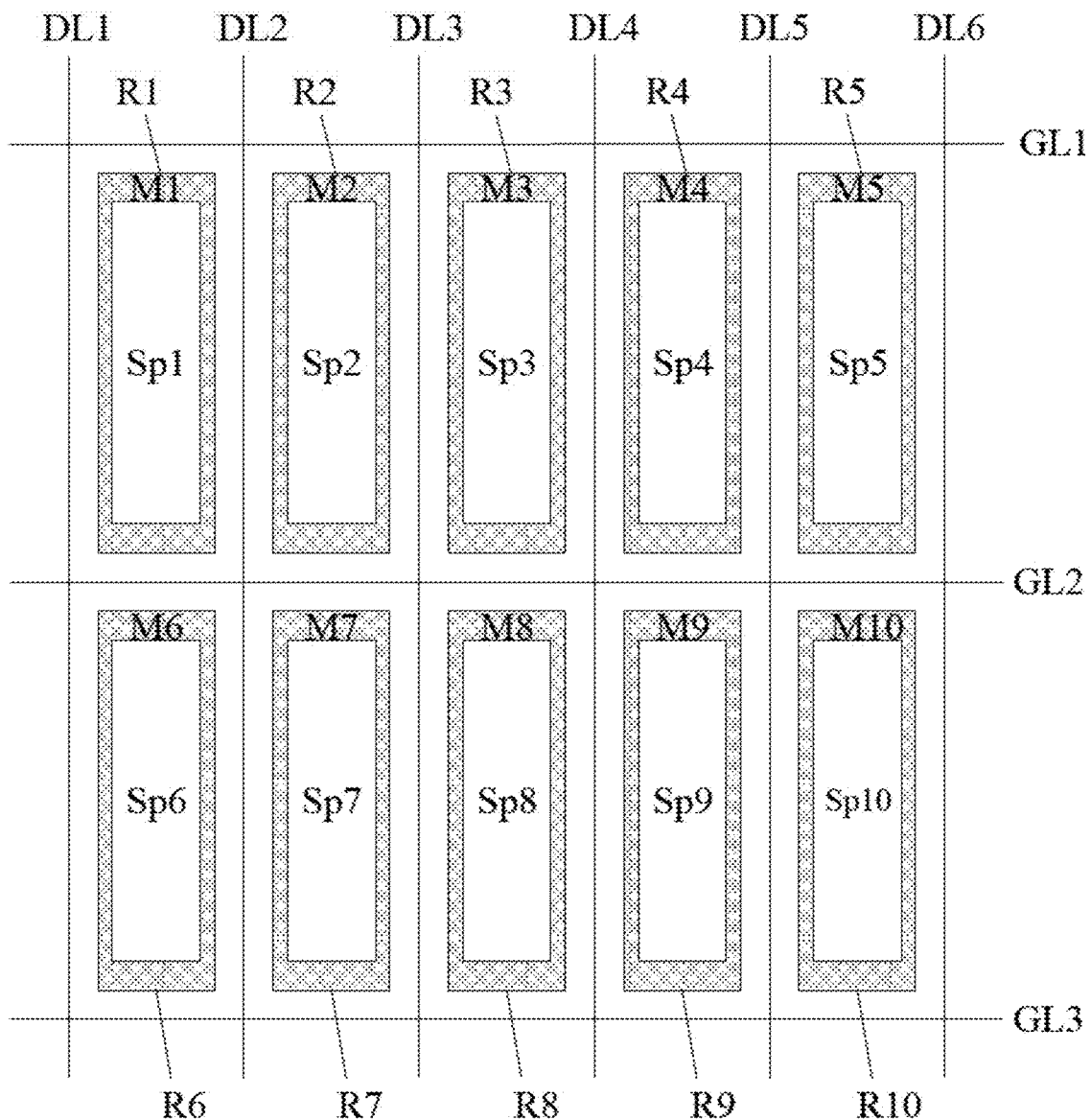
FIG. 2 is a schematic diagram illustrating a display panel having a light modulation region in some embodiments according to the present disclosure.

Various alternative implementations of the present disclosure may be practiced. FIG. 2 is a schematic diagram illustrating a display panel having a light modulation region in some embodiments according to the present disclosure. Referring to FIG. 2, the display panel includes a plurality of light modulators (M1, M2, M3, . . . , M10) in a plurality of light modulation regions (R1, R2, R3, . . . , R10). Each of the plurality of subpixels is associated with one of the plurality of light modulation regions. Each of the plurality of light modulation regions surrounds the corresponding subpixel of the plurality of subpixels. Light transmittance in each of the plurality of light modulation regions is controlled by one of the plurality of gate lines and one of the plurality of data lines for driving image display in one of the plurality of subpixels. For example, the light transmittance in a first light modulation region R1 is controlled by the first gate line GL1 and the first data line DL1 for driving image display in the first subpixel Sp1, the light transmittance in a second light modulation region R2 is controlled by the first gate line GL1 and the second data line DL2 for driving image display in the second subpixel Sp2, and so on.

Figure 3:
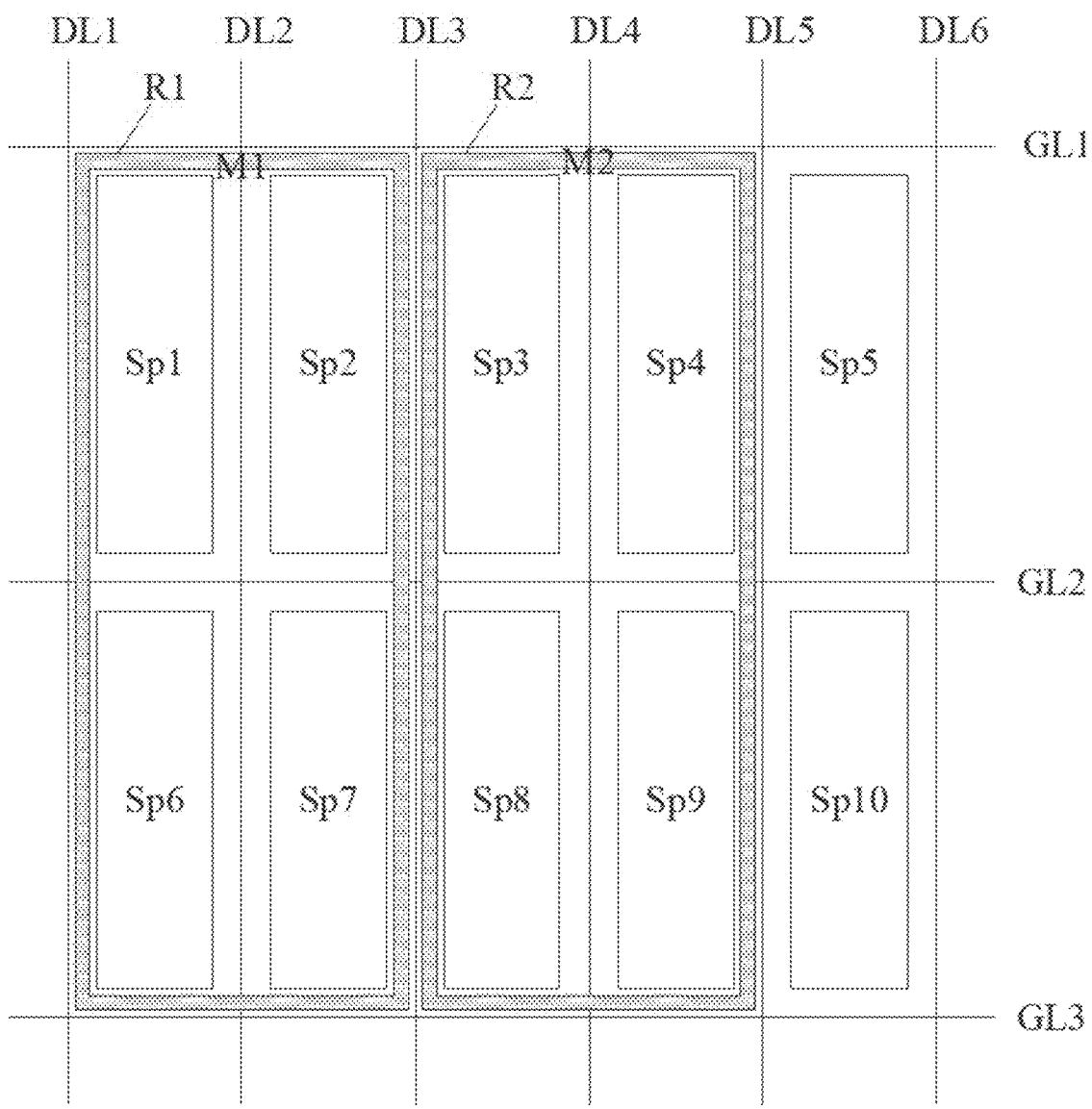
FIG. 3 is a schematic diagram illustrating a display panel having a light modulation region in some embodiments according to the present disclosure.

FIG. 3 is a schematic diagram illustrating a display panel having a light modulation region in some embodiments according to the present disclosure. Referring to FIG. 3, the display panel includes a plurality of light modulators (M1, M2) in a plurality of light modulation regions (R1, R2). Each of the plurality of light modulation regions (and each of the plurality of light modulators) is associated with on average four adjacent subpixels of the plurality of subpixels. Each of the plurality of light modulation regions surrounds the corresponding four adjacent subpixels of the plurality of subpixels. Light transmittance in each of the plurality of light modulation regions is controlled by one of the plurality of gate lines and one of the plurality of data lines for driving image display in one of the plurality of subpixels. For example, the light transmittance in a first light modulation region R1 is controlled by the first gate line GL1 and the first data line DL for driving image display in the first subpixel Sp1, the light transmittance in a second light modulation region R2 is controlled by the first gate line GL1 and a third data line DL3 for driving image display in a third subpixel Sp3.

Various appropriate light modulators may be used for modulating the display contrast of the display panel and the light transmittance in the light modulation region. Examples of appropriate light modulators include electrochromic type light modulators, electro-optic type light modulators (e.g., liquid crystal), electromechanical type light modulators, reflective light modulators, a microelectromechanical system (MEMS), and other types of light modulators.

Figure 4:
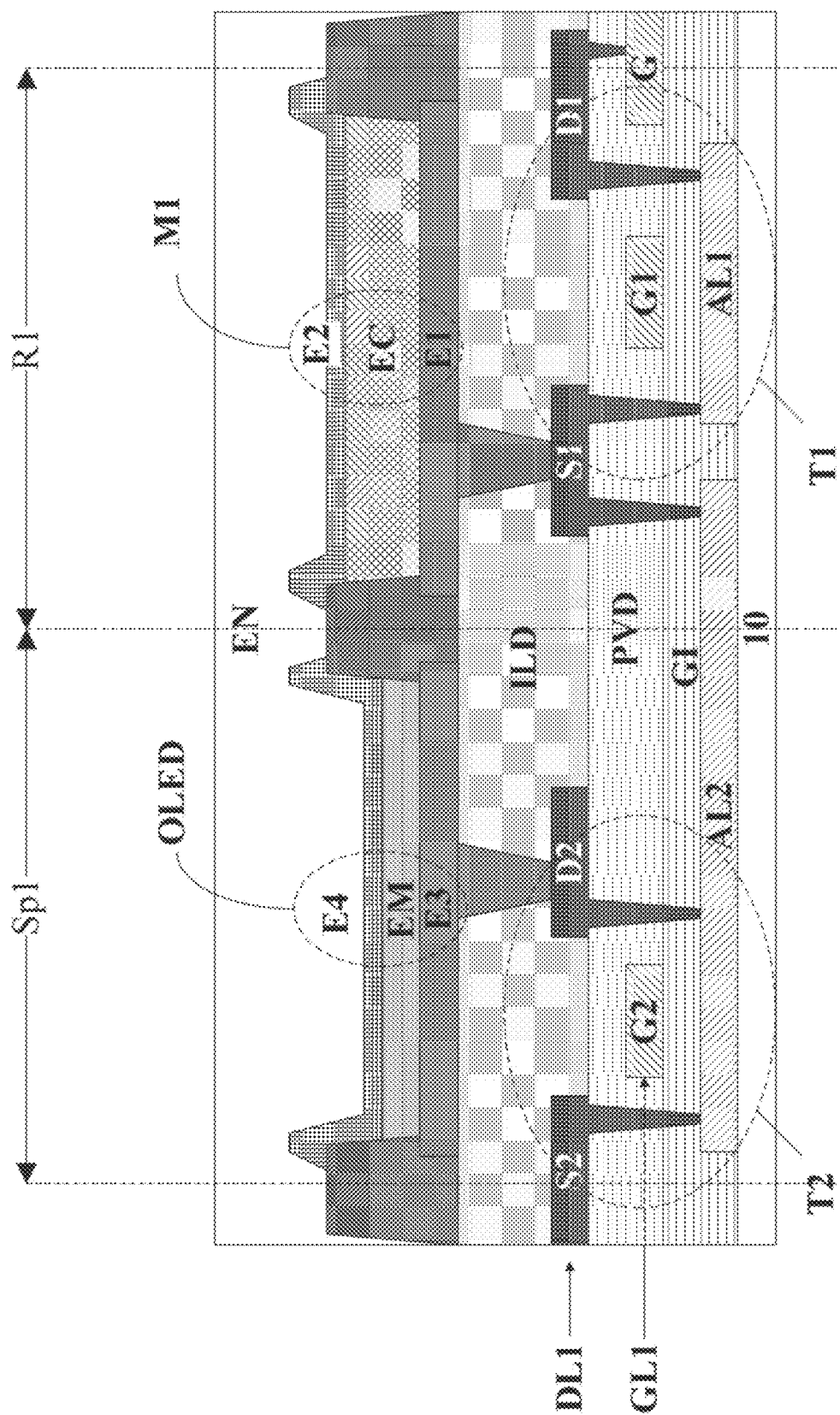
FIG. 4 is a schematic diagram illustrating a display panel having a light modulation region in some embodiments according to the present disclosure.

In some embodiments, the plurality of light modulators are electrochromic type light modulators. FIG. 4 is a schematic diagram illustrating a display panel having a light modulation region in some embodiments according to the present disclosure. A first light modulation region R1 is disposed on a side of a first subpixel Sp1. Referring to FIG. 4, the display panel in some embodiments includes a first light modulator M1 in the first light modulation region R. The first light modulator M1 includes a first electrode E1, an electrochromic layer EC on the first electrode E1, and a second electrode E2 on a side of the electrochromic layer EC distal to the first electrode E1.

Various appropriate materials and various appropriate fabricating methods may be used to make the electrochromic layer EC. For example, an electrochromic material may be deposited by a plasma-enhanced chemical vapor deposition (PECVD) process. The deposited electrochromic material layer is then patterned, e.g., by a lithographic process. Examples of appropriate electrochromic materials for making the electrochromic layer EC include tungsten oxide (e.g., $W_2O_5$), a combination of tungsten oxide and nickel oxide (e.g., $W_2O_5$ and NiO), niobium pentoxide, titanium oxide (e.g., $TiO_3$), cobalt oxide (CoO), a viologen electrochromic material or derivatives thereof, a metal-phthalocyanine electrochromic material or derivatives thereof (e.g., a lutetium-phthalocyanine electrochromic material or derivatives thereof), a polyaniline electrochromic material or derivatives thereof, a polypyrrole electrochromic material or derivatives thereof, a polythiophene electrochromic material or derivatives thereof, and a tetrathiafulvalene electrochromic material or derivatives thereof.

In the first subpixel Sp1, the display panel includes a display unit, e.g., an organic light emitting diode OLED. Various other types of display unit may be used in the present display panel. In one example, the display unit is a liquid crystal display unit having a pixel electrode, a common electrode and a liquid crystal layer. Referring to FIG. 4, the display panel includes a base substrate 10, a first thin film transistor T1 for controlling light transmittance in the first light modulation region R1 on the base substrate 10, a second thin film transistor T2 for driving image display in the first subpixel Sp1, an inter-layer dielectric layer ILD on a side of the first thin film transistor T1 and the second thin film transistor T2 distal to the base substrate 10. In the first subpixel Sp1, the display panel further includes a third electrode E3 on a side of the inter-layer dielectric layer ILD distal to the base substrate 10, an organic light emitting layer EM on a side of the third electrode E3 distal to the inter-layer dielectric layer ILD, a fourth electrode E4 on a side of the organic light emitting layer EM distal to the third electrode E3. Optionally, the third electrode E3 is an anode, and the fourth electrode E4 is a cathode. Optionally, the third electrode E3 is a cathode, and the fourth electrode E4 is an anode.

Optionally, the display panel further includes an encapsulating layer EN on a side of the second electrode E2 and the fourth electrode E4 distal to the base substrate 10. The encapsulating layer EN encapsulates the display unit.

In some embodiments, the first thin film transistor T1 includes a first active layer AL1 on the base substrate 10, a gate insulating layer GI on a side of the first active layer AL1 distal to the base substrate 10, a first gate electrode G1 on a side of the gate insulating layer GI distal to the base substrate 10, a passivation layer PVD on a side of the first gate electrode G1 distal to the gate insulating layer GI, a first source electrode S1 and a first drain electrode D1 on a side of the passivation layer PVD distal to the base substrate 10. The first electrode E1 of the first light modulator M1 is coupled to the first source electrode S1 through a via extending through the inter-layer dielectric layer ILD. The first drain electrode D1 is coupled to ground G through a via extending through the passivation layer PVD. The first gate electrode G1 is coupled to a first gate line GL1. The first drain electrode D1 is coupled to ground (e.g., a ground voltage or a fixed voltage).

In some embodiments, the second thin film transistor T2 includes a second active layer AL2 on the base substrate 10, a gate insulating layer GI on a side of the second active layer AL2 distal to the base substrate 10, a second gate electrode G2 on a side of the gate insulating layer GI distal to the base substrate 10, a passivation layer PVD on a side of the second gate electrode G2 distal to the gate insulating layer GL a second source electrode S2 and a second drain electrode D2 on a side of the passivation layer PVD distal to the base substrate 10. The second gate electrode G2 is coupled to the first gate line GL1. The second source electrode S2 is coupled to a first data line DL1. The second drain electrode D2 is coupled to the third electrode E3 in the first subpixel Sp1.

The first source electrode S1 of the first thin film transistor T1 is coupled to the second active layer AL2 of the second thin film transistor T2. When the second thin film transistor T2 is turned on by a first gate scanning signal provided to the second gate electrode G2, a first data signal provided to the second source electrode S2 passes through to the second drain electrode D2 of the second thin film transistor T2 and the first source electrode S1 of the first thin film transistor T1. The first data signal passed to the second drain electrode is used for driving image display in the first subpixel Sp1. The first data signal passed to the first source electrode S1 is used for controlling light transmittance in the first light modulation region R1.

Optionally, the third electrode E3 in the first subpixel Sp1 and the first electrode E1 in the first light modulation region R1 are in a same layer and made of a same electrode material. Optionally, the fourth electrode E4 in the first subpixel Sp1 and the second electrode E2 in the first light modulation region R1 are in a same layer and made of a same electrode material. As used herein, the term "same layer" refers to the relationship between the layers simultaneously formed in the same step. In one example, the third electrode E3 in the first subpixel Sp1 and the first electrode E1 in the first light modulation region R1 are in a same layer when they are formed as a result of one or more steps of a same patterning process performed in a same layer of material. In another example, the third electrode E3 in the first subpixel Sp1 and the first electrode E1 in the first light modulation region R1 can be formed in a same layer by simultaneously performing the step of forming the third electrode E3 in the first subpixel Sp1 and the step of forming the first electrode E1 in the first light modulation region R1. The term "same layer" does not always mean that the thickness of the layer or the height of the layer in a cross-sectional view is the same.

Optionally, the first light modulation region R is substantially non-overlapping with the plurality of subpixels in the display panel, e.g., non-overlapping with the first subpixel Sp1. Optionally, the first light modulation region R1 is partially overlapping with one of the plurality of subpixels, e.g., partially overlapping with the first subpixel Sp1. Optionally, the first light modulation region R1 is substantially overlapping with one of the plurality of subpixels. e.g., substantially overlapping with the first subpixel Sp1.

Optionally, the first subpixel Sp1 is a subpixel adjacent to the first light modulation region R1 (see, e.g., FIG. 4). Optionally, the first subpixel Sp1 is a subpixel not adjacent to the first light modulation region R1.

Figure 5:
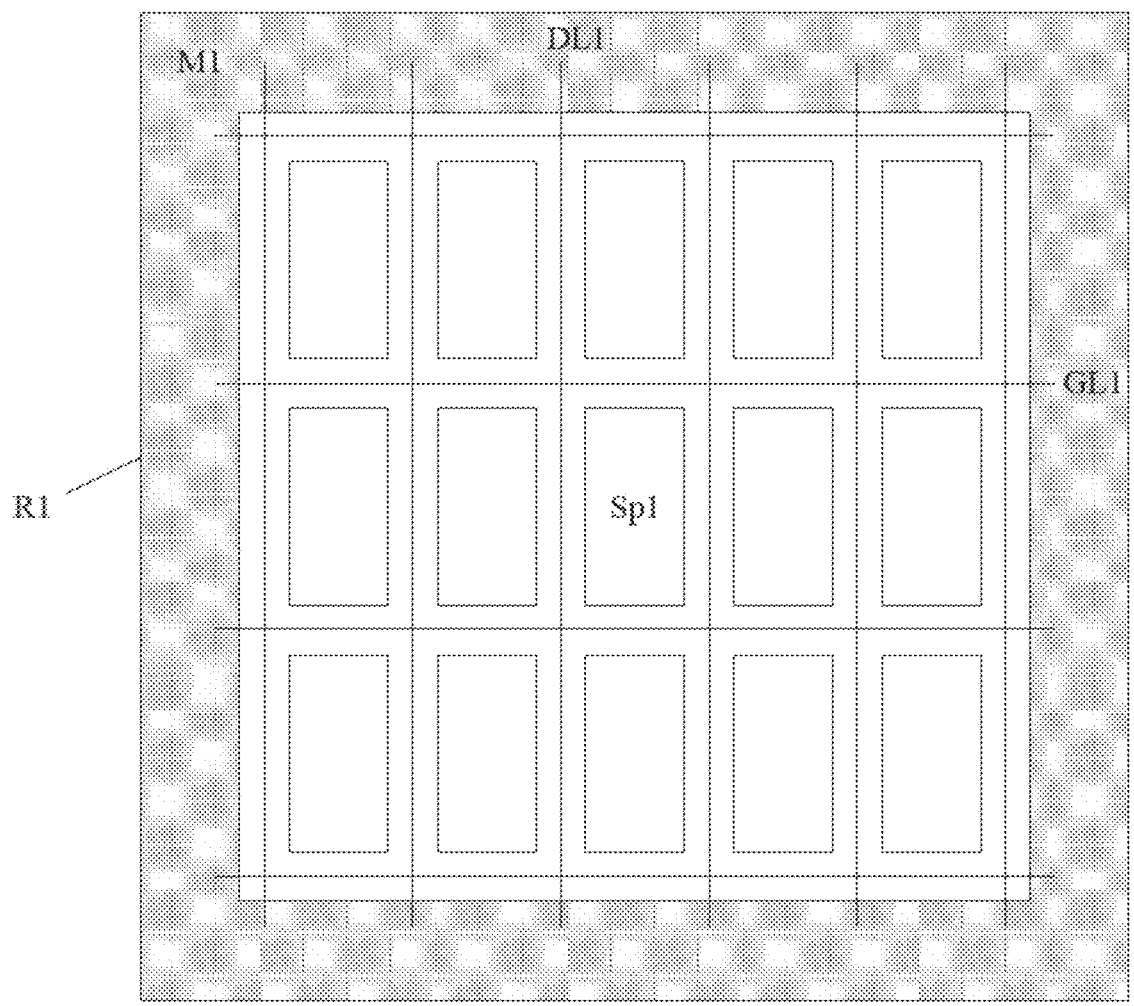
FIG. 5 is a schematic diagram illustrating a display panel having a light modulation region in some embodiments according to the present disclosure.

Optionally, the first subpixel Sp1 is a subpixel not directly adjacent to the first light modulation region R1. FIG. 5 is a schematic diagram illustrating a display panel having a light modulation region in some embodiments according to the present disclosure. Referring to FIG. 5, the display panel in some embodiments includes a first light modulation region R1 surrounding a plurality of subpixels (including a first subpixel Sp1 in the center). The image display in the first subpixel Sp1 is driven by the first gate line GL1 and the first data line DLL. The display panel includes a first light modulator M1 in the first light modulation region R1. Light transmittance in the first light modulation region is controlled by the first gate line GL1 and the first data line DL1. In FIG. 5, the first subpixel Sp1 is not directly adjacent to the first light modulation region R1, e.g., they are separated by one or more subpixels.

Figure 6:
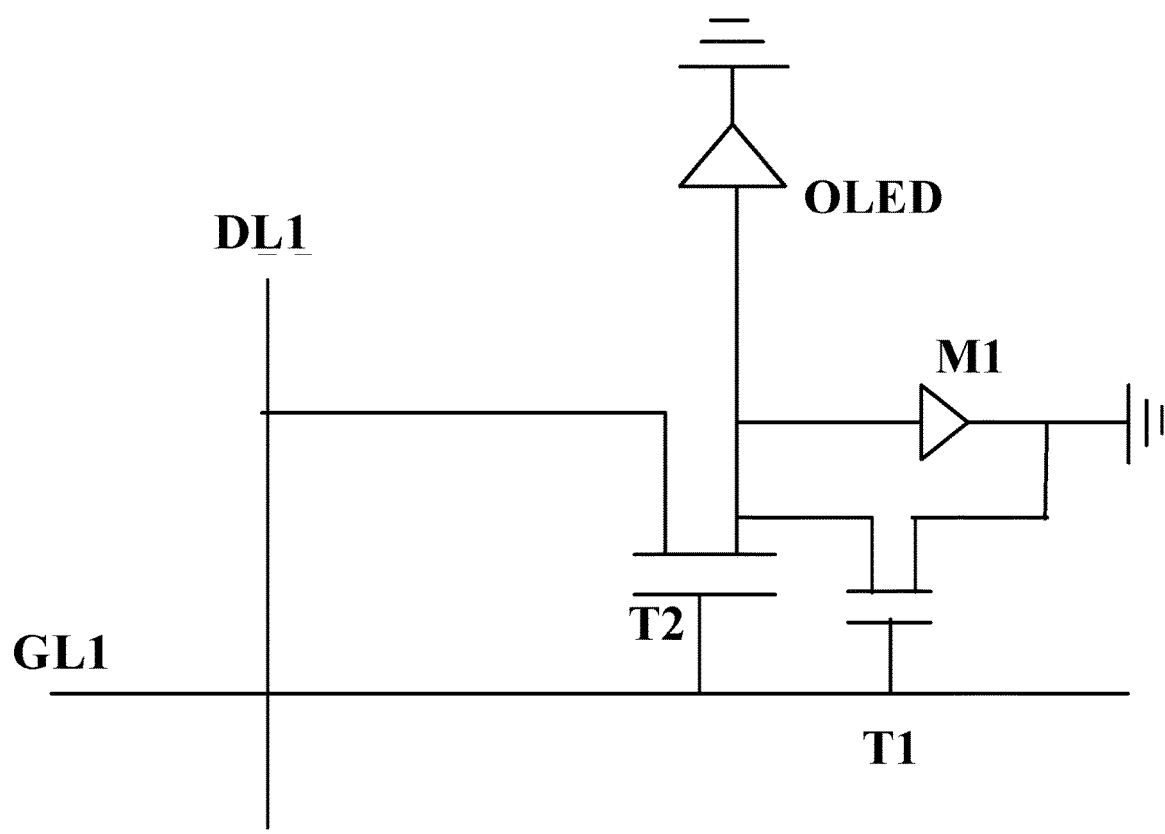
FIG. 6 is a circuit diagram of a circuit for modulating display contrast of a display panel in some embodiments according to the present disclosure.

FIG. 6 is a circuit diagram of a circuit for modulating display contrast of a display panel in some embodiments according to the present disclosure. Referring to FIG. 6, the display unit OLED is driven by the first gate line GL1 and the first data line DL1 for image display. When a first gate scanning signal is provided to the first gate line GL1, the first thin film transistor T1 and the second thin film transistor T2 are turned on. A first data signal is provided to the first date line DL1. When the second thin film transistor T2 is turned on, the first data signal is passed to the display unit OLED, and the display unit OLED emits light. At the same time, because the first thin film transistor T1 is also turned on by the first gate scanning signal, the first data signal is passed to the first light modulator M1 (e.g., the first electrode of the first light modulator M1). By applying the first data signal (or a signal derived from the first data signal) to the first light modulator M1, the light transmittance of the electrochromic layer in the first light modulator M1 can be controlled. The higher the voltage level applied to the first light modulator M1, the lower the light transmittance of the electrochromic layer. Thus, in the present display panel, light transmittance in the light modulation region can be controlled using a same gate line and a same data line for driving image display in a subpixel. When the first data signal has a zero voltage, no voltage is applied to the first light modulator M1, the light modulation region can be maintained substantially transparent. When the first data signal has a low voltage, the light transmittance in the light modulation region is lowered. When the first data signal has a high voltage, the light modulation region becomes substantially non-transparent. Thus, when the display panel is used for image display, the background light (ambient light) is substantially blocked in the image display region, thereby enhancing the display contrast. When the display panel is not used for image display, the background light is allowed to transmit through the display panel.

In some embodiments, the display panel is a transparent display panel. As used herein, the term "transparent display panel" refers to a display panel capable of permitting light incident from a back side of the display panel to pass through at the same time displaying a graphic image. Optionally, the transparent display panel in the context of the present disclosure has a transmittance of at least 20% or more. The transparent display panel according to the present disclosure include transparent liquid crystal display panels and transparent organic light emitting diode display panels. Examples of transparent display panels include transparent display panels in a form of a window in a room, a building, an appliance, car windshields, a vehicle head-up display, eye glasses, binoculars, visors, helmets, and so on.

Optionally, the display panel is a liquid crystal display panel. Optionally, the display panel is an organic light emitting diode display panel. Optionally, the display panel is an electrophoretic display panel.

Figure 7:
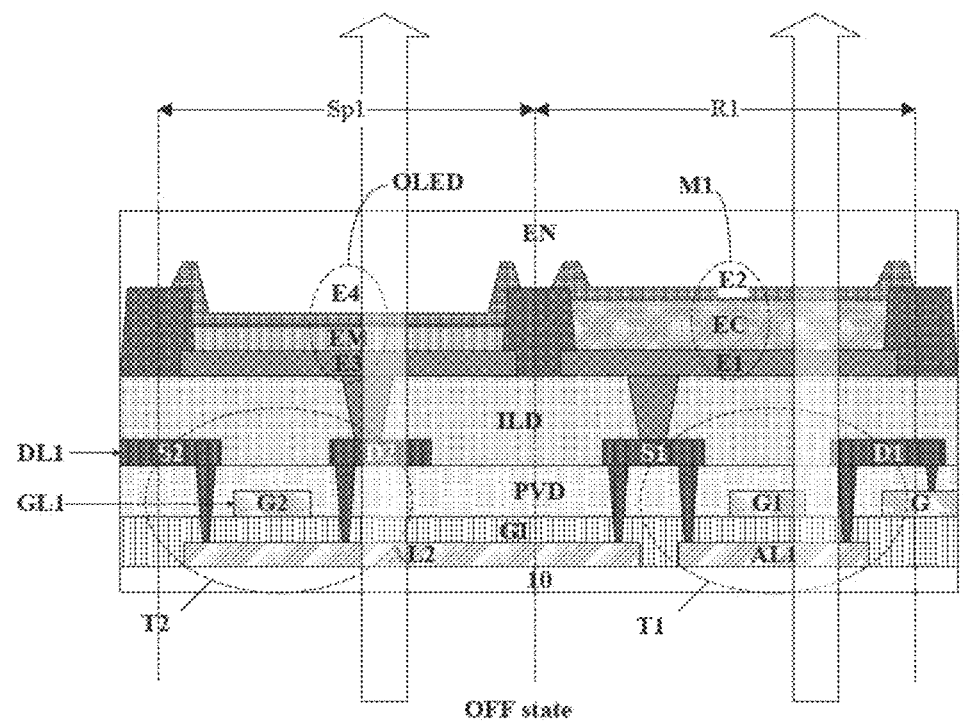
FIG. 7 illustrates light transmittance in the light modulation region when the display panel is in an OFF state.

FIG. 7 illustrates light transmittance in the light modulation region when the display panel is in an OFF state. In some embodiments, the display panel is a transparent display panel. As shown in FIG. 7, the ambient light transmits through the first light modulation region R1 and the first subpixel Sp1. The display panel is substantially transparent.

Figure 8:
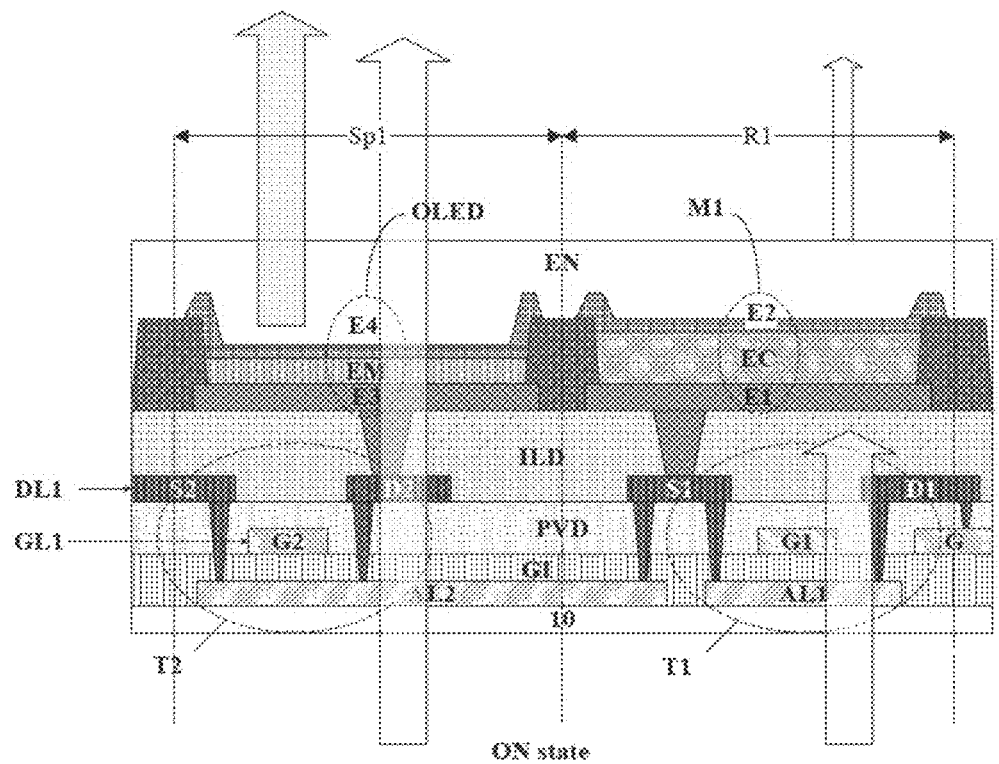
FIG. 8 illustrates light transmittance in the light modulation region when the display panel is in an ON state.

FIG. 8 illustrates light transmittance in the light modulation region when the display panel is in an ON state. Referring to FIG. 8, the first subpixel Sp1 emits light when the display panel is in an ON state. The first light modulator M1 in the first light modulation region R1 is also turned on to modulate the light transmittance in the first light modulation region R1. As the data signal is provided to the first electrode E, the light transmittance of the electrochromic layer EC is lowered, thereby blocking at least a part of the ambient light from transmitting through the display panel. Thus, the background light in the first light modulation region R1 is reduced when the first subpixel Sp1 is configured to emit light for image display. By having this design, the display contrast of the display panel in its image display region is significantly enhanced.

In some embodiments, the first thin film transistor T1 is a leaky transistor. When the first thin film transistor T1 is tinned on to allow the application of the data signal to the first electrode E1, a leakage current between the first source electrode S1 and the first drain electrode D1 of the first thin film transistor T1 lowers the voltage level of the first data signal. A voltage level of the voltage signal actually applied to the first electrode E1 is lower than the voltage level of the first data signal. By having a leaky thin film transistor as the first thin film transistor T1, the gray level of the first light modulation region R1 can be kept consistent with the gray level of the display unit OLED. As used herein, the term "gray level" refers to an amplitude level of a color component or a black-and-white component, e.g., between black and white or between color levels. Optionally, the amplitude levels include 256 gray levels (e.g., from 0 to 255).

Figure 9:
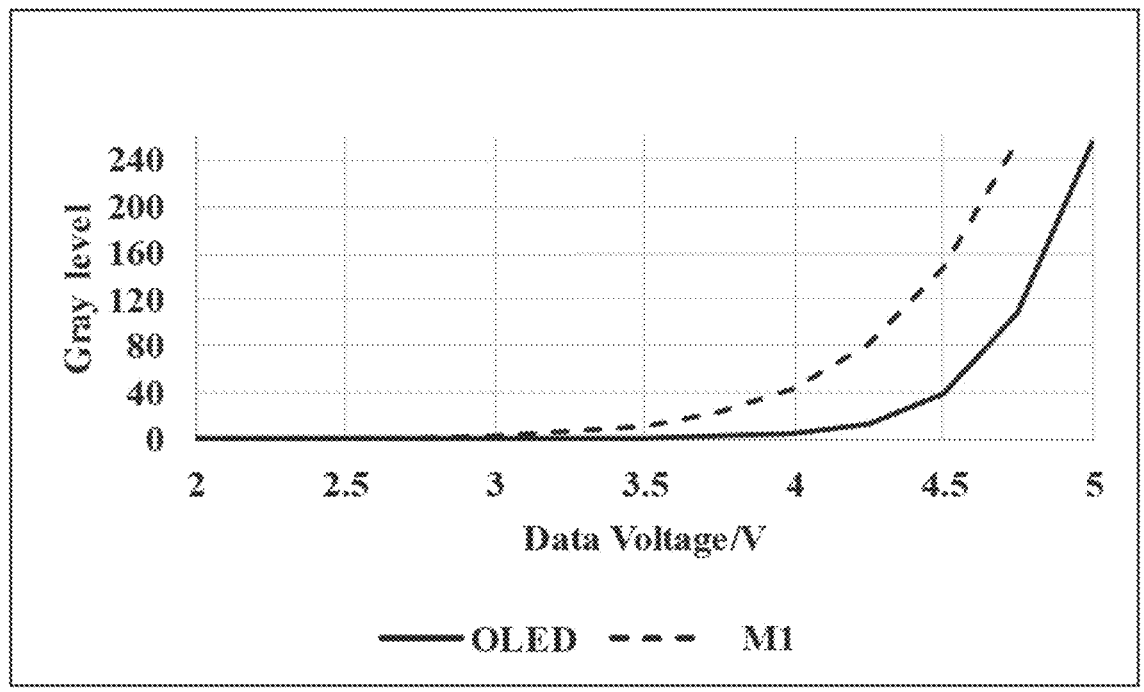
FIG. 9 illustrates gray levels of the light modulation region and the first subpixel upon application of a first data signal in a display panel in some embodiments according to the present disclosure.
Figure 10:
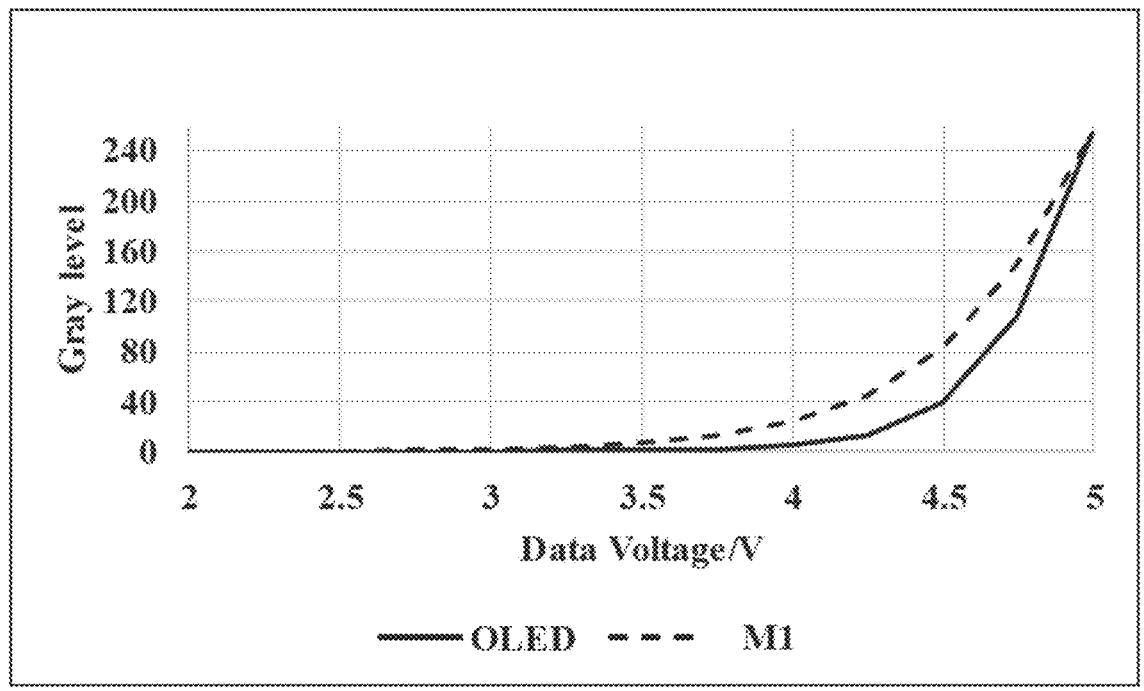
FIG. 10 illustrates gray levels of the light modulation region and the first subpixel upon application of a first data signal in a display panel in some embodiments according to the present disclosure.
Figure 11:
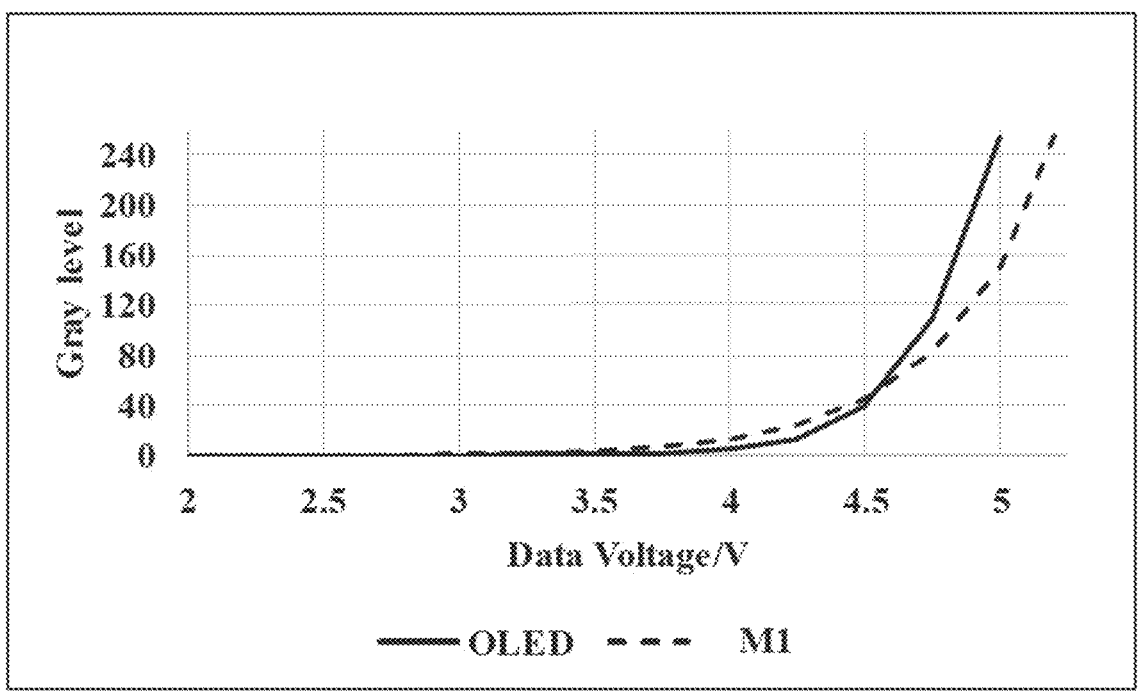
FIG. 11 illustrates gray levels of the light modulation region and the first subpixel upon application of a first data signal in a display panel in some embodiments according to the present disclosure.

The leaky thin film transistor can be designed to have a leakage current that substantially minimizing a difference between a gray level of the light modulation region and a gray level of the first subpixel upon application of a first data signal through the first data line. FIGS. 9 to 11 illustrate gray levels of the light modulation region and the first subpixel upon application of a first data signal in a display panel in some embodiments according to the present disclosure. Referring to FIGS. 9 to 11, the leakage current of the leaky thin film transistor in FIG. 10 is one that most effectively minimizes the difference between the gray levels of the light modulation region and the first subpixel. The leakage current of the leaky thin film transistor may be varied by varying the aspect ratio of the channel region of the thin film transistor.

In another aspect, the present disclosure provides a method of modulating display contrast of the display panel. In some embodiments, the method includes providing a first gate scanning signal to the first gate line and a first data signal to the first date line for driving image display in the first subpixel of the plurality of subpixels; and modulating the light transmittance in the light modulation region using the first gate scanning signal and the first data signal. Optionally, the step of modulating the light transmittance includes lowering the light transmittance in the light modulation region by applying to the first electrode the first data signal or a voltage signal derived from the first data signal. Optionally, the step of applying to the first electrode the voltage signal derived from the first data signal includes lowering the voltage level of the first data signal applied to the first electrode. Optionally, the step of lowering the voltage level of the first data signal is performed by a leaky thin film transistor.

In some embodiments, the method further includes providing the first gate scanning signal to the first gate line to turn on the second thin film transistor thereby allowing the first data signal to pass from the source electrode of the second thin film transistor to the drain electrode of the second thin film transistor for driving image display in the first subpixel. Optionally, the method further includes providing the first gate scanning signal to the first gate line to turn on the first thin film transistor thereby allowing the first data signal to pass from the source electrode of the first thin film transistor to the drain electrode of the first thin film transistor.

In another aspect, the present disclosure provides a method of fabricating a display panel having an array of a plurality of subpixels. In some embodiments, the method includes forming a plurality of light modulators configured to modulate display contrast of the display panel, each of the plurality of light modulators is formed in a light modulation region configured to allow light transmitting through the display panel; and forming a plurality of gate lines and forming a plurality of data lines for driving image display in the plurality of subpixels. Optionally, the plurality of light modulators, the plurality of gate lines, and the plurality of data lines are formed so that light transmittance in the light modulation region is controlled by a first gate line and a first data line for driving image display in a first subpixel of the plurality of subpixels.

In some embodiments, each of the plurality of light modulators is formed to comprise a first electrode, an electrochromic layer on the first electrode, and a second electrode on a side of the electrochromic layer distal to the first electrode. Optionally, the method further includes forming a first thin film transistor in the light modulation region having a gate electrode coupled to the first gate line, a source electrode coupled to the first electrode, and a drain electrode coupled to ground.

In some embodiments, the method further includes forming the first thin film transistor as a leaky thin film transistor. Optionally, the first thin film transistor is formed to have a leakage current such that a difference between a gray level of the light modulation region and a gray level of the first subpixel upon application of a first data signal through the first data line are substantially minimized over a range of data voltage levels.

Optionally, the method further includes forming a second thin film transistor in the first subpixel having a gate electrode coupled to the first gate line, a source electrode coupled to the first data line, and a drain electrode coupled to a third electrode in the first subpixel.

In another aspect, the present disclosure provides a display apparatus including a display panel described herein or fabricated by a method described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated.

It is intended that the scope of the invention be defined by the claims appended hereto and their equivalents in which all terms are meant in their broadest reasonable sense unless otherwise indicated. Therefore, the term"the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having an array of a plurality of subpixels, comprising:
   a plurality of light modulators configured to modulate display contrast of the display panel, wherein an individual one of the plurality of light modulators is in a light modulation region;
   wherein image display in a first subpixel of the plurality of subpixels and light transmittance in the light modulation region are controlled by a first gate line and a first data line;
   the light modulation region is substantially non-overlapping with the first subpixel;
   wherein the display panel comprises:
   a first thin film transistor in the light modulation region, comprising a first gate electrode coupled to the first gate line, a first source electrode coupled to a first electrode, and a first drain electrode coupled to ground; and
   a second thin film transistor in the first subpixel, comprising a second gate electrode coupled to the first gate line, a second source electrode coupled to the first data line, and a second drain electrode coupled to a third electrode in the first subpixel;
   wherein the second thin film transistor in the first subpixel further comprising a second active layer connected to the first source electrode of the first thin film transistor; and
   the second source electrode of the second thin film transistor is configured to receive a first data signal, the first data signal passing through the second source electrode of the second thin film transistor to the first source electrode of the first thin film transistor.

2. The display panel of claim 1, wherein the individual one of the plurality of light modulators comprises the first electrode, an electrochromic layer on the first electrode, and a second electrode on a side of the electrochromic layer distal to the first electrode.

3. The display panel of claim 1, wherein the first thin film transistor is a leaky transistor.

4. The display panel of claim 1, wherein the third electrode in the first subpixel and the first electrode in the light modulation region are in a same layer and made of a same material, the third electrode being an anode of a light emitting element.

5. The display panel of claim 1, further comprising an organic light emitting layer on a side of the third electrode distal to the second thin film transistor; and
   a fourth electrode on a side of the organic light emitting layer distal to the third electrode;
   wherein the fourth electrode in the first subpixel and the second electrode in the light modulation region are in a same layer and made of a same material.

6. The display panel of claim 1, wherein the light modulation region is substantially non-overlapping with the plurality of subpixels.

7. The display panel of claim 1, wherein the first subpixel is a subpixel adjacent to the light modulation region.

8. The display panel of claim 1, wherein a number of the plurality of light modulators is substantially the same as a number of the plurality of subpixels.

9. The display panel of claim 1, wherein the display panel is a transparent display panel.

10. A display apparatus, comprising the display panel of claim 1.

11. A method of image display, comprising:
    modulating display contrast of a display panel by a plurality of light modulators, wherein an individual one of the plurality of light modulators is in a light modulation region;
    providing a first gate scanning signal to a first gate line and a first data signal to a first date line for driving image display in a first subpixel of a plurality of subpixels;
    modulating light transmittance in the light modulation region using the first gate scanning signal and the first data signal;
    the light modulation region is substantially non-overlapping with the first subpixel; and
    wherein the display panel comprises:
    a first thin film transistor in the light modulation region, comprising a first gate electrode coupled to the first gate line, a first source electrode coupled to the first electrode, and a first drain electrode coupled to ground; and
    a second thin film transistor in the first subpixel, comprising a second gate electrode coupled to the first gate line, a second source electrode coupled to the first data line, and a second drain electrode coupled to a third electrode in the first subpixel;
    wherein the second thin film transistor in the first subpixel further comprising a second active layer connected to the first source electrode of the first thin film transistor; and
    the method further comprises:
    providing the first gate scanning signal to the first gate line to turn on the second thin film transistor thereby allowing the first data signal to pass from the second source electrode of the second thin film transistor to the second drain electrode of the second thin film transistor for driving image display in the first subpixel, and allowing the first data signal passing through the second source electrode of the second thin film transistor to the first source electrode of the first thin film transistor; and
    providing the first gate scanning signal to the first gate line to turn on the first thin film transistor thereby allowing the first data signal transmitted from the second source electrode of the second thin film transistor to pass from the first source electrode of the first thin film transistor to the first drain electrode of the first thin film transistor.

12. The method of claim 11, wherein the individual one of the plurality of light modulators comprises the first electrode, an electrochromic layer on the first electrode, and a second electrode on a side of the electrochromic layer distal to the first electrode; and modulating the light transmittance comprises lowering the light transmittance in the light modulation region by applying to the first electrode a voltage signal derived from the first data signal.

13. The method of claim 11, wherein the first thin film transistor is a leaky transistor; and a voltage level of the voltage signal applied to the first electrode is lower than a voltage level of the first data signal.

14. A method of fabricating a display panel having an array of a plurality of subpixels, comprising:

forming a plurality of light modulators configured to modulate display contrast of the display panel, wherein an individual one of the plurality of light modulators is formed in a light modulation region configured to allow light transmitting through the display panel; and forming a plurality of gate lines and forming a plurality of data lines for driving image display in the plurality of subpixels;

wherein the plurality of light modulators, the plurality of gate lines, and the plurality of data lines are formed so that light transmittance in the light modulation region is controlled by a first gate line and a first data line for driving image display in a first subpixel of the plurality of subpixels;

the light modulation region is substantially non-overlapping with the first subpixel;

wherein the method further comprises:

forming a first thin film transistor in the light modulation region outside the first subpixel, comprising a first gate electrode coupled to the first gate line, a first source electrode coupled to a first electrode, and a first drain electrode coupled to ground; and forming a second thin film transistor in the first subpixel outside the light modulation region, comprising a second gate electrode coupled to the first gate line, a second source electrode coupled to the first data line, and a second drain electrode coupled to a third electrode in the first subpixel;

wherein forming the second thin film transistor in the first subpixel further comprising forming a second active layer connected to the first source electrode of the first thin film transistor; and the second source electrode of the second thin film transistor is configured to receive a first data signal, the first data signal passing through the second source electrode of the second thin film transistor to the first source electrode of the first thin film transistor.

15. The method of claim 14, wherein the individual one of the plurality of light modulators is formed to comprise the first electrode, an electrochromic layer on the first electrode, and a second electrode on a side of the electrochromic layer distal to the first electrode.

16. The method of claim 15, wherein the first thin film transistor is formed to have a leakage current such that a difference between a gray level of the light modulation region and a gray level of the first subpixel upon application of a first data signal through the first data line are substantially minimized over a range of data voltage levels.

* * * * *